United States Patent
Tien et al.

(10) Patent No.: US 9,219,048 B2
(45) Date of Patent: Dec. 22, 2015

(54) SUBSTRATE HAVING PILLAR GROUP AND SEMICONDUCTOR PACKAGE HAVING PILLAR GROUP

(71) Applicant: Advanced Semiconductor Engineering, Inc., Kaohsiung (TW)

(72) Inventors: Yun-Hsiang Tien, Kaohsiung (TW); Yi-Chuan Ding, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 14/304,528

(22) Filed: Jun. 13, 2014

(65) Prior Publication Data
US 2014/0367852 A1 Dec. 18, 2014

(30) Foreign Application Priority Data
Jun. 14, 2013 (TW) .............................. 102121208 A (51) Int. Cl.
*H01L 23/00* (2006.01)
(52) U.S. Cl.
CPC ................ *H01L 24/14* (2013.01); *H01L 24/06* (2013.01); *H01L 2224/14104* (2013.01)
(58) Field of Classification Search
CPC ....................... H01L 24/14; H01L 2224/14104
USPC ........................................................ 257/737
See application file for complete search history.

(56) References Cited

U.S. PATENT DOCUMENTS

| 2007/0103182 | A1* | 5/2007 | Nawata | 324/765 |
|---|---|---|---|---|
| 2007/0273049 | A1* | 11/2007 | Khan et al. | 257/787 |
| 2011/0248399 | A1* | 10/2011 | Pendse | 257/737 |
| 2013/0062764 | A1* | 3/2013 | Jin | 257/738 |
| 2013/0093079 | A1* | 4/2013 | Tu et al. | 257/737 |
| 2013/0099371 | A1* | 4/2013 | Cheng et al. | 257/737 |

* cited by examiner

*Primary Examiner* — Christine Enad
(74) *Attorney, Agent, or Firm* — Foley & Lardner LLP; Cliff Z. Liu; Angela D. Murch (57) ABSTRACT

The present disclosure provides a substrate and a semiconductor package. The substrate includes a body, at least one pad group, a plurality of traces and at least one pillar group. The pad group includes a plurality of pads. Each pad has at least one inner side and at least one outer side. The inner side of a first pad is faced to the inner side of an adjacent second pad with a spaced section between. Each pillar group includes a plurality of pillars disposed on respective ones of the pads. The use of pad groups having multiple pads on which to form pillars allows an increase in the number of the pillars available in a given area so as to increase the amount of I/O connections. Furthermore, for a given number of I/O connections, the area occupied by the pads, pillars and traces can be reduced.

19 Claims, 12 Drawing Sheets

SUBSTRATE HAVING PILLAR GROUP AND SEMICONDUCTOR PACKAGE HAVING PILLAR GROUP

CROSS REFERENCE TO RELATED APPLICATIONS

This application claims the benefit of Taiwan Patent Application No. 102121208, filed 14 Jun. 2013, the contents of which are incorporated herein by reference in their entirety.

BACKGROUND

1. Technical Field

The present disclosure relates to a substrate and a semiconductor package, and more particularly to a substrate having pillar groups and a semiconductor package having pillar groups.

2. Description of the Related Art

Conventional metal pillars are disposed at the periphery of a substrate and surround a chip on the substrate, so as to serve as input/output (I/O) connections for interconnection with other substrates. However, based on the structure of the current conventional metal pillars, it is difficult to further increase the number of conventional metal pillars on the substrate, and thus the number of I/O for interconnection is limited.

SUMMARY

One embodiment of the present disclosure is directed to a substrate. The substrate includes a body, at least one conductive pad group, a plurality of conductive traces and at least one metal pillar group. The body has a surface. The at least one conductive pad group is disposed on the surface. Each conductive pad group includes a plurality of conductive pads, each conductive pad has at least one inner side and at least one outer side. An inner side of a conductive pad is faced to an inner side of an adjacent conductive pad within a conductive pad group, and the first inner side and the second inner side are separated by a narrow spaced section. The conductive traces are electrically connected to respective ones of the conductive pads. The at least one metal pillar group is formed on the at least one conductive pad group. Each metal pillar group includes a plurality of metal pillars formed on respective ones of the conductive pads in a conductive pad group.

Another embodiment of the present disclosure is directed to a semiconductor package. The semiconductor package includes a first substrate, a second substrate, a chip and a mold compound. The first substrate includes a first body, at least one conductive pad group, a plurality of conductive traces, and at least one metal pillar group. The first body has a surface. The at least one conductive pad group is disposed on the surface. Each conductive pad group includes a plurality of conductive pads, each conductive pad has at least one inner side and at least one outer side. An inner side of a conductive pad is faced to an inner side of an adjacent conductive pad in a conductive pad group, with a narrow spaced section between. The conductive traces are electrically connected to respective ones of the conductive pads. The at least one metal pillar group is formed on the at least one conductive pad group, each metal pillar group comprises a plurality of metal pillars formed on respective ones of the conductive pads of a conductive pad group. The second substrate includes a second body and a plurality of conductive contacts. The second body has a second surface faced to the first surface of the first substrate, and the conductive contacts of the second substrate are electrically connected to ones of the at least one metal pillar group of the first substrate. The chip is disposed on the first substrate and is electrically connected to the conductive traces of the first substrate. The mold compound is disposed between the first substrate and the second substrate The use of a conductive pad group having several conductive pads allows for several metal pillars of a metal pillar group to be correspondingly disposed on the several conductive pads. Thus, for a given area, the number of I/O connections is increased; and for a given number of I/O connections, the area occupied by conductive pads, metal pillars, and conductive traces is reduced.

BRIEF DESCRIPTION OF THE DRAWINGS

Common reference numerals are used throughout the drawings and the detailed description to indicate the same elements. The present disclosure will be more apparent from the following detailed description taken in conjunction with the accompanying drawings.

DETAILED DESCRIPTION

Figure 1:
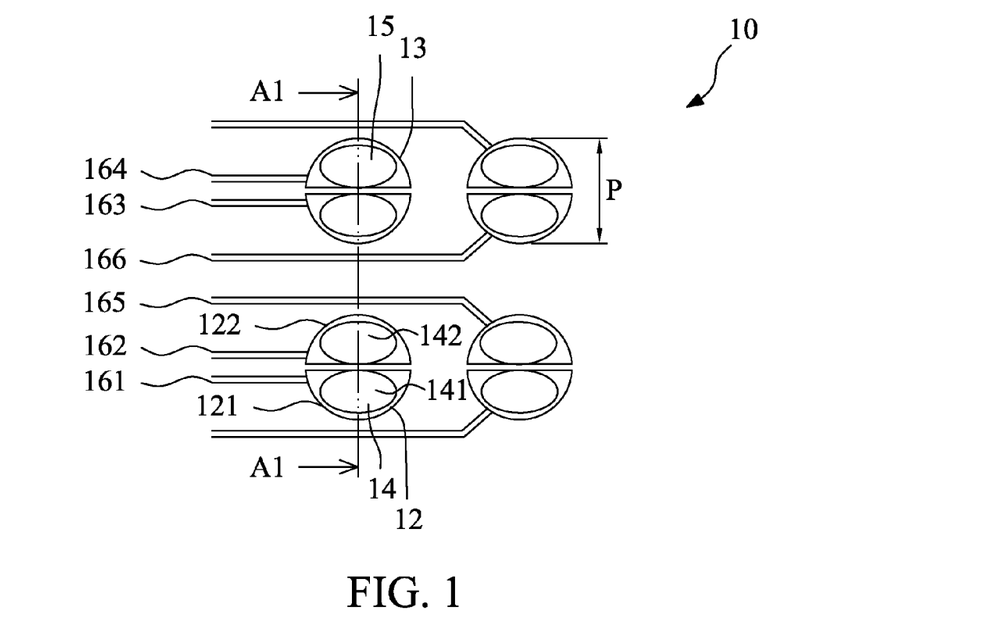
FIG. 1 is a top schematic view of a substrate having metal pillar groups according to a first embodiment of the present disclosure.
Figure 2:
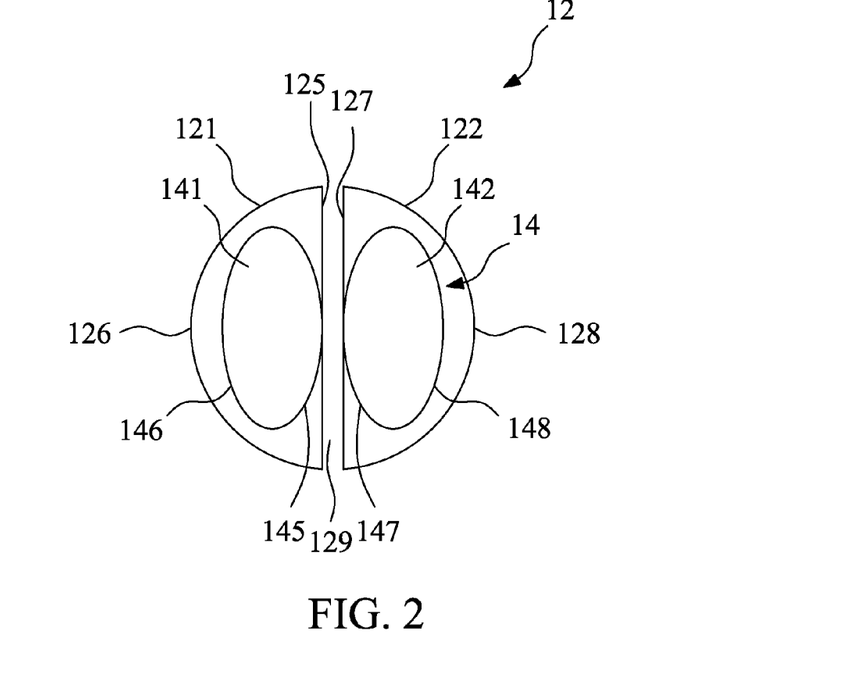
FIG. 2 is a partial enlarged top schematic view of a conductive pad group and metal pillar group according to the first embodiment of the present disclosure.
Figure 3:
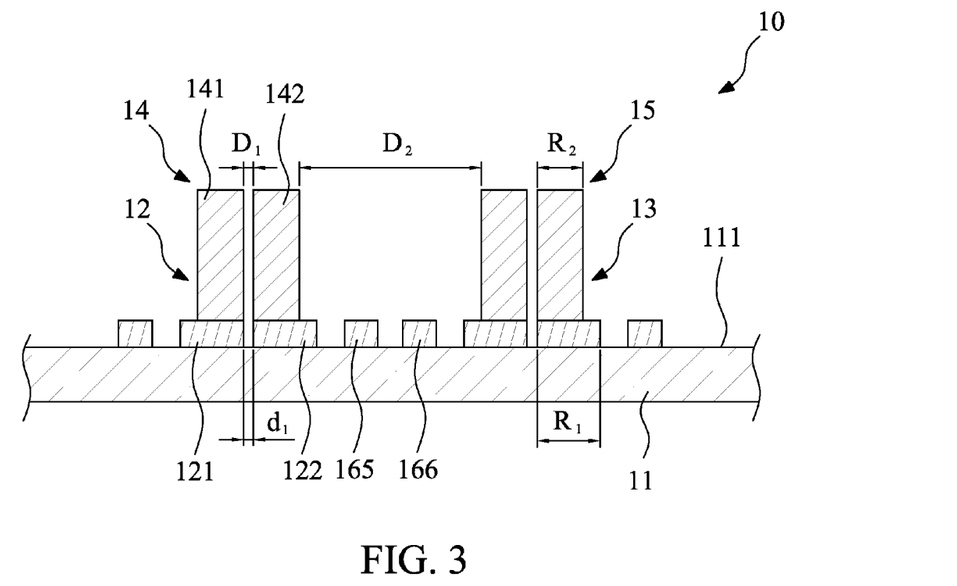
FIG. 3 is a cross-sectional schematic view along a sectional line A1-A1 in FIG. 1.

FIG. 1 is a schematic view of a substrate having metal pillar groups according to a first embodiment of the present disclosure. FIG. 2 is a partial enlarged schematic view of a conductive pad group and metal pillar group according to the first embodiment of the present disclosure. FIG. 3 is a cross-sectional schematic view along a sectional line A1-A1 in FIG. 1. Referring to FIG. 1 to FIG. 3, the substrate 10 of the first embodiment includes: a body 11, conductive pad groups including conductive pad groups 12, 13, conductive traces including conductive traces 161, 162, 163, 164, 165, 166, and metal pillar groups including metal pillar groups 14, 15. The body 11 has a surface 111.

As illustrated in FIG. 3, conductive pad groups 12, 13 are disposed on the surface 111. Each conductive pad group in the first embodiment includes a plurality of conductive pads. In this embodiment, the conductive pad group 12 includes two conductive pads 121, 122, and each conductive pad has an inner side and an outer side. As illustrated in FIG. 2, conductive pad 121 has an inner side 125 and an outer side 126, and conductive pad 122 has an inner side 127 and an outer side 128. The inner side 125 of the conductive pad 121 is faced to the inner side 127 of the adjacent conductive pad 122 and a narrow spaced section 129 is formed between the inner sides 125, 127. In this embodiment, the inner side 125 of the conductive pad 121 is parallel to the inner side 127 of the adjacent conductive pad 122; that is, the narrow spaced section 129 has parallel sides.

The narrow spaced section 129 may be formed, for example, by patterning and etching, or by mechanical or laser sawing. A width of the narrow spaced section 129 may depend on the technique used to form the section 129, and may be, for example, about 1 µm or less using laser sawing, or with patterning and etching may be about 8 µm or less, or about 2 µm or less. For example, the width of the narrow spaced section 129 may be in the range of about 1 µm and a distance between metal pillars supported by the conductive pads 121 and 122, such as in the range of about 2 µm and the distance between the metal pillars, or in the range of about 8 µm and the distance between the metal pillars. Reducing the width of the narrow spaced section 129 can provide the benefit of fine-pitch, while providing mechanical stability to the supported metal pillars.

In the first embodiment, other conductive pad groups, such as conductive pad group 13, are constructed in a similar fashion to conductive pad group 12, as seen in FIG. 1. In other embodiments, conductive pad groups may be constructed differently.

The conductive traces 161-166 are electrically connected to respective ones of the conductive pads. The metal pillar groups are formed on respective ones of the conductive pad groups. For example, metal pillar groups 14, 15 are formed on the conductive pad groups 12, 13, respectively. Each metal pillar group 14, 15 in the first embodiment includes a plurality of metal pillars. In this embodiment, the metal pillar group 14 includes two metal pillars 141, 142 formed on the two conductive pads 121, 122, respectively, of the conductive pad group 12. In this embodiment, an outer perimeter of the conductive pad group 12 is circular, the two conductive pads 121, 122 are semicircular, and the two metal pillars 141, 142 are elliptical.

In the first embodiment, other metal pillar groups, such as metal pillar group 15, are formed on conductive pad groups in a similar fashion to metal pillar group 14 formed on conductive pad group 12. In other embodiments, different metal pillar groups may be formed differently.

Metals of the metal pillars may be, for example, any one or a combination of copper, silver, gold, aluminum, nickel, tungsten, tin, lead, zinc, or other metal or metal alloy. The term "metal pillar" is used throughout this disclosure for ease of reference. However, it is within the scope of this disclosure that any metal pillar in any embodiment may be replaced with a pillar of another conductive material.

In the first embodiment as illustrated in FIG. 1, four conductive pad groups (including conductive pad groups 12, 13) each have an outer perimeter of approximately diameter 'P'. Comparing to a conventional conductive pad with diameter 'P', because one conductive pad group of the this embodiment has two conductive pads and thus two metal pillars can be correspondingly disposed, the number of metal pillars can be significantly increased, up to a factor of two of more. Thus, the number of I/O connections may be increased for a given area; and for a given number of I/O connections, the area occupied by conductive pads, metal pillars, and conductive traces may be reduced.

In the first embodiment, each metal pillar has an inner side and an outer side. The metal pillar 141 has an inner side 145 and an outer side 146. The metal pillar 142 has an inner side 147 and an outer side 148. In this embodiment, as illustrated in FIG. 2, the inner side 145 of the metal pillar 141 partially aligns with the corresponding inner side 125 of the conductive pad 121, and the inner side 147 of the metal pillar 142 partially aligns with the corresponding inner side 127 of the conductive pad 122. Therefore, in this embodiment, as illustrated in FIG. 3, the minimum distance '$D_1$' between the inner side 145 of the metal pillar 141 and the inner side 147 of the metal pillar 142 is the same as the distance '$d_1$' between the inner side 125 of the conductive pad 121 and the inner side 127 of the adjacent conductive pad 122.

Also illustrated in FIG. 3 is a measure '$R_1$' and '$R_2$', shown for the outer conductive pad of conductive pad group 13 and the outer metal pillar of metal pillar group 15, respectively, where "$R_1$' and '$R_2$' are substantially similar for other conductive pads and metal pillars of the first embodiment. Thus, for an example of conductive pad 122 and metal pillar 142, the maximum distance '$R_2$' between the inner side 147 of the metal pillar 142 and the outer side 148 of the metal pillar 142 is smaller than the maximum distance 'R$_1$' between the inner side 127 of the conductive pad 122 and the outer side 128 of the conductive pad 122. In this manner, the area of the metal pillar 142 can extend and expand towards the outer side 128 of the conductive pad 122.

Further, in the first embodiment, forming the metal pillars towards the edges of the conductive pads (e.g., forming metal pillar 142 towards inner side 127 of conductive pad 122) increases a minimum distance 'D$_2$' between metal pillar groups (e.g., the outer side 148 of the metal pillar 142 of the metal pillar group 14 and the outer side of a metal pillar of the adjacent metal pillar group 15), which helps a mold compound to successfully flow between metal pillar groups over the distance D$_2$ in a subsequent process.

The substrate of the first embodiment, and other embodiments of the present disclosure, can further include a seed layer (not shown) formed between the conductive pads and the metal pillars. In some embodiments, the substrate 10 does not contain any active component (for example, an active chip or active circuitry). Substrate 10 may be, for example, a printed circuit board. In other embodiments, the substrate 10 can include an active circuitry or active chip.

In the first embodiment, conductive pad group 12 may be coplanar with the conductive traces 161-166, or may alternatively project from the conductive traces 161-166.

The conductive pad group 12 and the conductive traces 161-166 can be formed, for example, by using a dry film to define a pattern and then etching to form the conductive pad group 12 and the conductive traces 161-166 at the same time. In some embodiments, a conductive pad is formed and then cut into a plurality of small conductive pads, for example using laser cutting, to form a conductive pad group such as conductive pad group 12. In some embodiments, a metal pillar group such as metal pillar group 15 may be formed by forming a seed layer on a corresponding conductive pad group and then using plating to form the metal pillar group. In other embodiments, a conductive paste may be filled in a space defined by a patterned dry film, and then the dry film is removed to form a metal pillar.

Figure 4:
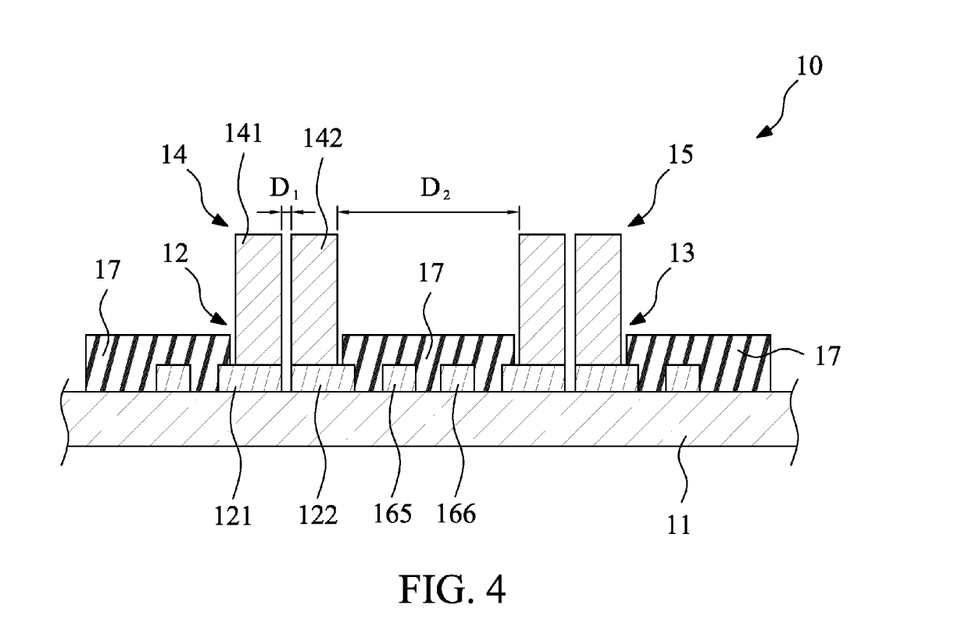
FIG. 4 is a cross-sectional schematic view of a substrate having a metal pillar groups according to a second embodiment of the present disclosure.

FIG. 4 is a cross-sectional schematic view of a substrate having metal pillar groups according to a second embodiment of the present disclosure. The difference between the second embodiment and the first embodiment is that the substrate 10 of the second embodiment further includes a dielectric layer 17 (e.g., solder mask or other dielectric material) surrounding the outer side of the conductive pads such as conductive pads 121, 122. The dielectric layer 17 may extend over a portion of at least one conductive pad, such as extending over portions of the conductive pads 121, 122. The dielectric layer 17 covers conductive traces such as the conductive traces 165, 166, and in some embodiments may contact ones of the metal pillars, such as metal pillars 141, 142 of metal pillar group 14.

Figure 5:
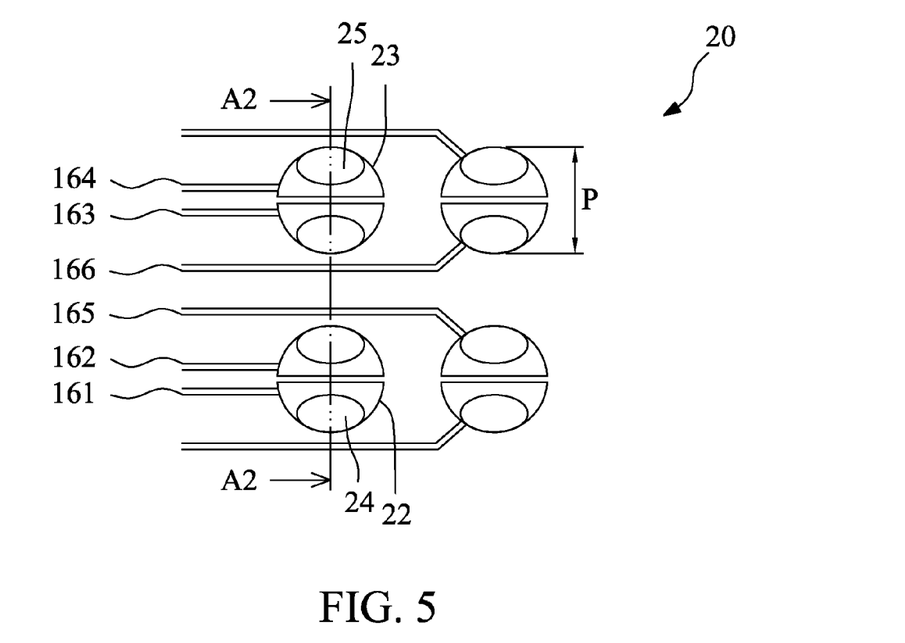
FIG. 5 is a schematic view of a substrate having a metal pillar group according to a third embodiment of the present disclosure.
Figure 6:
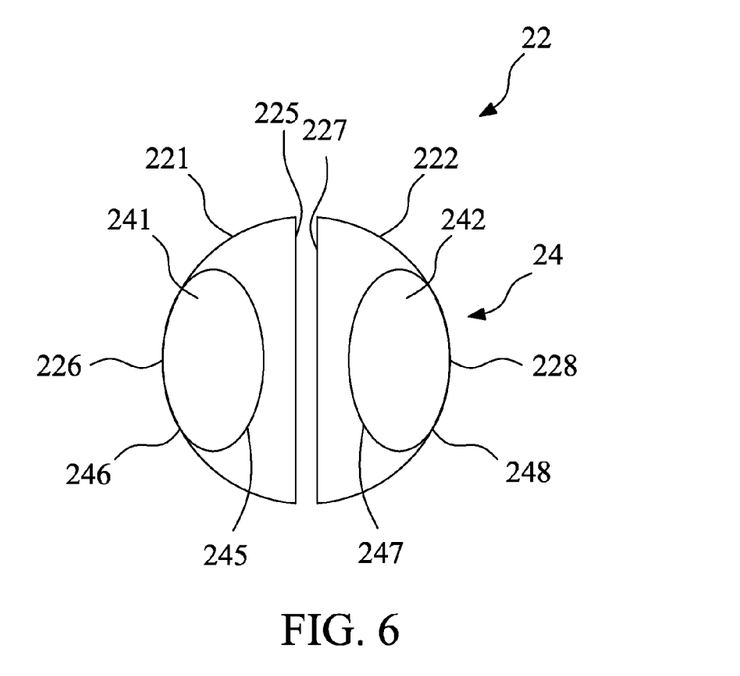
FIG. 6 is a partial enlarged schematic view of a conductive pad group and a metal pillar group according to the third embodiment of the present disclosure.
Figure 7:
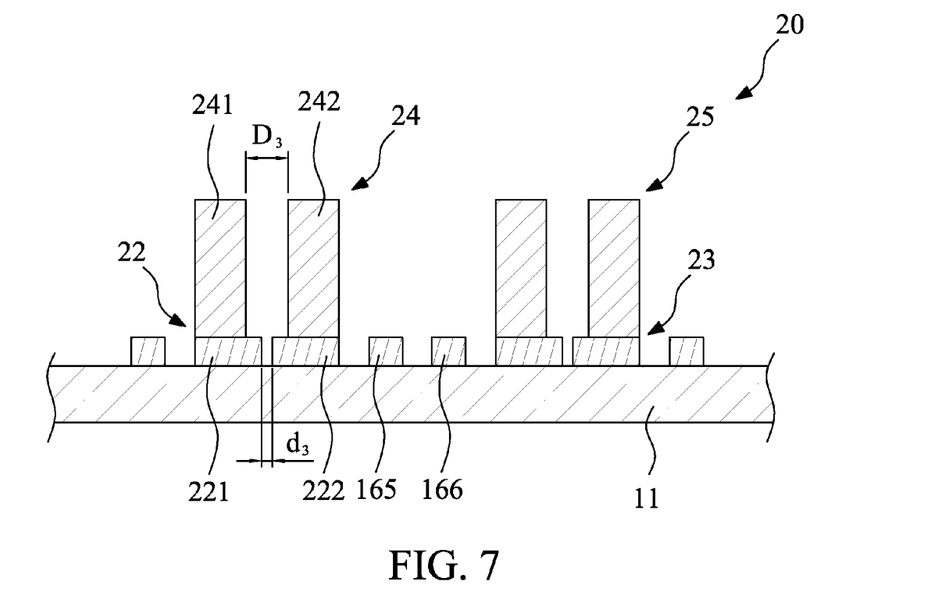
FIG. 7 is a cross-sectional schematic view along a sectional line A2-A2 in FIG. 5.

FIG. 5 is a schematic view of a substrate having metal pillar groups according to a third embodiment of the present disclosure. FIG. 6 is a partial enlarged schematic view of a conductive pad group and a metal pillar group according to the third embodiment of the present disclosure. FIG. 7 is a cross-sectional schematic view along a sectional line A2-A2 in FIG. 5. With reference to the first embodiment and the second embodiment, similar components in the third embodiment are labeled with the same component numbers. Referring to FIG. 5 to FIG. 7, the substrate 20 includes: a body 11, conductive pad groups including conductive pad groups 22, 23, conductive traces including conductive traces 161, 162, 163, 164, 165, 166, and metal pillar groups including metal pillar groups 24, 25.

In the third embodiment, the conductive pad group 22 includes two conductive pads 221, 222. The conductive pad 221 has an inner side 225 and an outer side 226. The conductive pad 222 has an inner side 227 and an outer side 228. The metal pillar group 24 includes two metal pillars 241, 242 formed on the two conductive pads 221, 222, respectively of the conductive pad group 22. The metal pillar 241 has an inner side 245 and an outer side 246. The metal pillar 242 has an inner side 247 and an outer side 248. In this embodiment, the outer side 246 of the metal pillar 241 partially aligns with the corresponding outer side 226 of the conductive pad 221, and the outer side 248 of the metal pillar 242 partially aligns with the corresponding outer side 228 of the conductive pad 222. The minimum distance 'D$_3$' (FIG. 7) between the inner side 245 of the metal pillar 241 and the inner side 247 of the metal pillar 242 is larger than the minimum distance 'd$_3$' between the inner side 225 of the conductive pad 221 and the inner side 227 of the adjacent conductive pad 222.

In the third embodiment, the distance 'D$_3$' between the inner side 245 of the metal pillar 241 and the inner side 247 of the metal pillar 242 may be increased. This capability mitigates the possibility that, when a metal pillar is formed by plating, it is difficult to control evenness of holes where metal pillars are to be formed due to an excessively large depth-to-width ratio in a dry film process. Thus, there is a reduced risk of a short circuit connection (e.g., bridge) between the metal pillars 241 and 242 of the metal pillar group 24.

Figure 8:
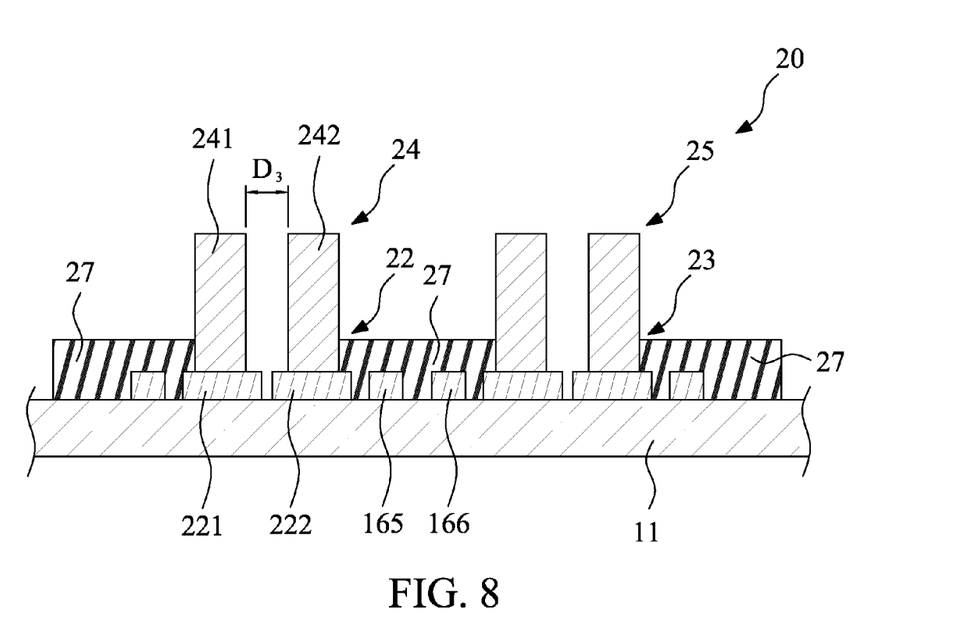
FIG. 8 is a cross-sectional schematic view of a substrate having metal pillar groups according to a fourth embodiment of the present disclosure.

FIG. 8 is a cross-sectional schematic view of a substrate having metal pillar groups according to a fourth embodiment of the present disclosure. The difference between the fourth embodiment and the third embodiment is that the metal pillars 241, 242 are disposed on a more central position of the conductive pads 221, 222, respectively, in the fourth embodiment as compared to the third embodiment. The substrate 20 of the fourth embodiment further includes a dielectric layer 27 surrounding the outer side of the conductive pads such as conductive pads 221, 222. For example, the dielectric layer 27 contacts the outer side of the conductive pads 221, 222, covers part of the conductive pads 221, 222, contacts the outer side of the metal pillars 241, 242, and covers traces 165, 166.

Figure 9:
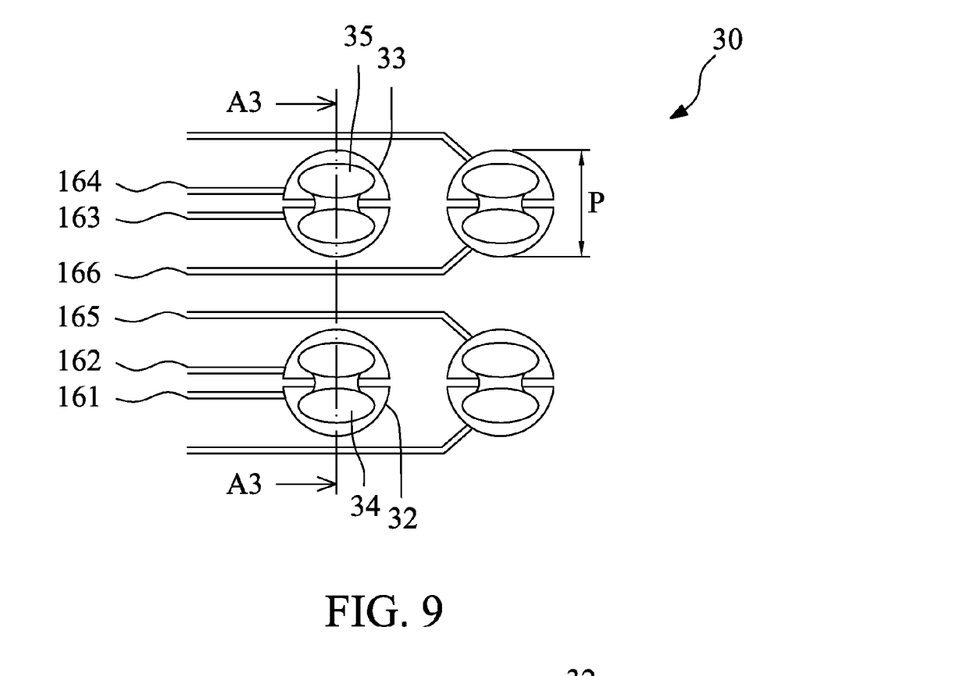
FIG. 9 is a schematic view of a substrate having a metal pillar group according to a fifth embodiment of the present disclosure.
Figure 10:
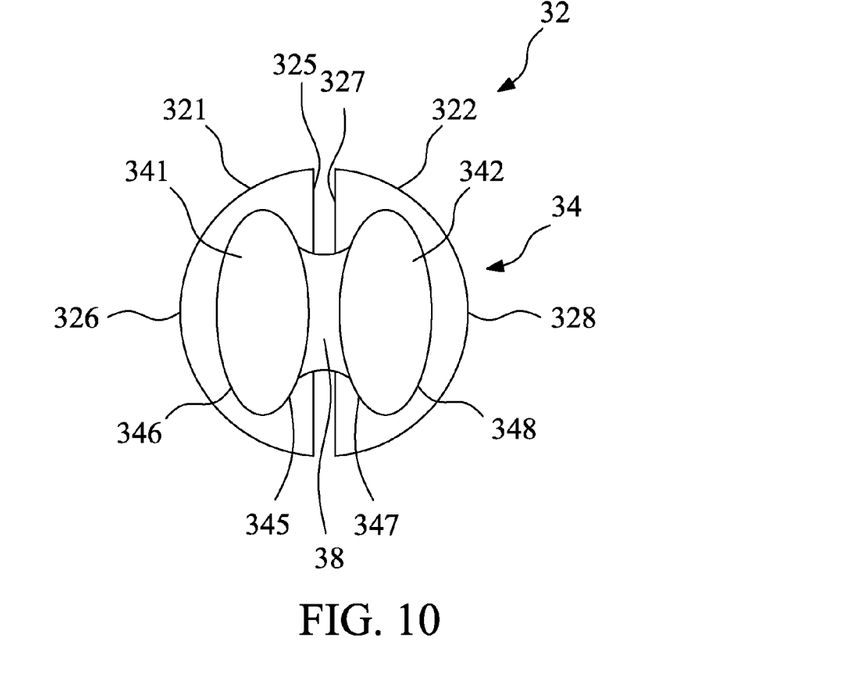
FIG. 10 is a partial enlarged schematic view of a conductive pad group and a metal pillar group according to the fifth embodiment of the present disclosure.
Figure 11:
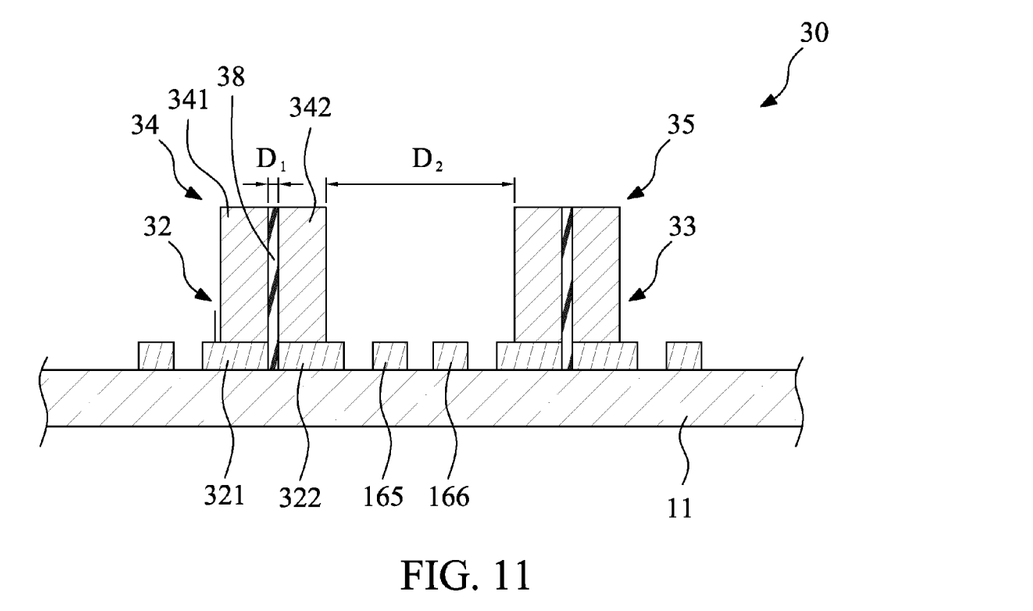
FIG. 11 is a cross-sectional schematic view along a sectional line A3-A3 in FIG. 9.

FIG. 9 is a schematic view of a substrate having metal pillar groups according to a fifth embodiment of the present disclosure. FIG. 10 is a partial enlarged schematic view of a conductive pad group and a metal pillar group according to the fifth embodiment of the present disclosure. FIG. 11 is a cross-sectional schematic view along a sectional line A3-A3 in FIG. 9. With reference to the first embodiment and the second embodiment, similar components in the fifth embodiment are labeled with the same component numbers. Referring to FIG. 9 to FIG. 11, the substrate 30 includes: a body 11, conductive pad groups including conductive pad groups 32, 33, conductive traces including conductive traces 161, 162, 163, 164, 165, 166, and metal pillar groups including metal pillar groups 34, 35.

In the fifth embodiment, the conductive pad group 32 includes two conductive pads 321, 322. The conductive pad 321 has an inner side 325 and an outer side 326. The conductive pad 322 has an inner side 327 and an outer side 328. The metal pillar group 34 includes two metal pillars 341, 342 formed on the two conductive pads 321, 322, respectively, of the conductive pad group 32. The metal pillar 341 has an inner side 345 and an outer side 346. The metal pillar 342 has an inner side 347 and an outer side 348. In this embodiment, the inner side 345 of the metal pillar 341 partially aligns with the corresponding inner side 325 of the conductive pad 321, and the inner side 347 of the metal pillar 342 partially aligns with the corresponding inner side 327 of the conductive pad 322 (see FIG. 11).

The substrate 30 of the fifth embodiment further includes an insulating material 38, provided between the inner side 325 of the conductive pad 321 and the inner side 327 of the adjacent conductive pad 322 of the conductive pad group 32, and between the inner side 345 of the metal pillar 341 and the inner side 347 of the adjacent metal pillar 342 of the metal pillar group 34. The insulating material 38 may be, for example, a dry film material.

In the fifth embodiment, the minimum distance '$D_1$' between the inner side 345 of the metal pillar 341 and the inner side 347 of the metal pillar 342, and the distance '$D_2$' between the outer side 348 of the metal pillar 342 and the inner side of the adjacent metal pillar group 35, are similar to the distance '$D_1$' and distance '$D_2$', respectively, in the first embodiment and have the same effects as those in the first embodiment. The insulating material 38 reduces the probability of a short circuit connection (e.g., bridge) occurring between the metal pillars 341 and 342 of the metal pillar group 34. The insulating material 38 further provides support for the metal pillars 341 and 342 of the metal pillar group 34, which increases the mechanical strength of the metal pillars 341 and 342.

Figure 12:
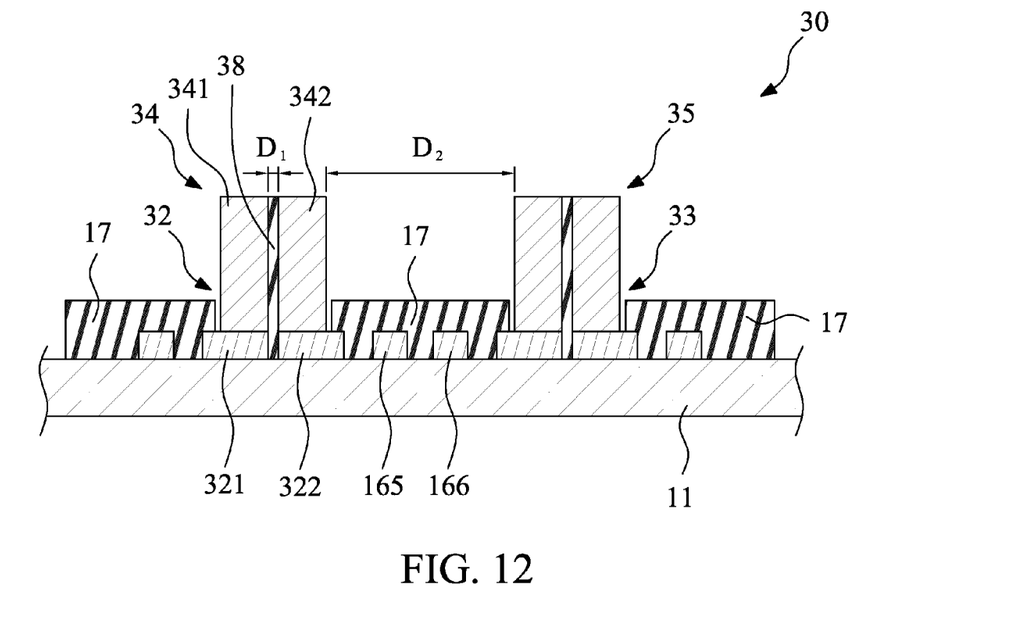
FIG. 12 is a cross-sectional schematic view of a substrate having metal pillar groups according to a sixth embodiment of the present disclosure.

FIG. 12 is a cross-sectional schematic view of a substrate having metal pillar groups according to a sixth embodiment of the present disclosure. The difference between the sixth embodiment and the fifth embodiment is that the substrate 30 of the sixth embodiment further includes a dielectric layer 17 surrounding the outer side of the conductive pads such as conductive pads 321, 322. For example, the dielectric layer 17 covers the outer side and may extend over a portion of the top of the conductive pads 321, 322, and covers the conductive traces 165, 166.

Figure 13:
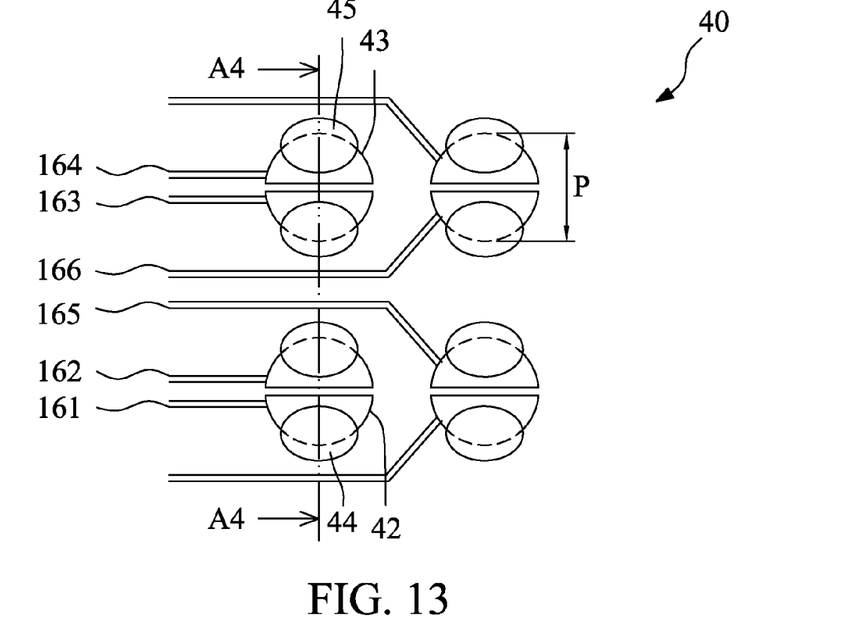
FIG. 13 is a schematic view of a substrate having a metal pillar group according to a seventh embodiment of the present disclosure.
Figure 14:
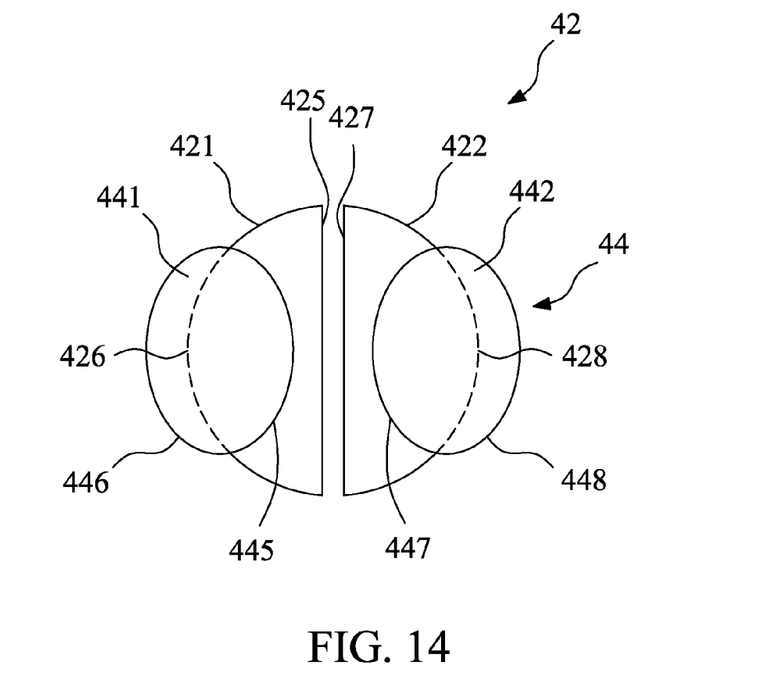
FIG. 14 is a partial enlarged schematic view of a conductive pad group and a metal pillar group according to the seventh embodiment of the present disclosure.
Figure 15:
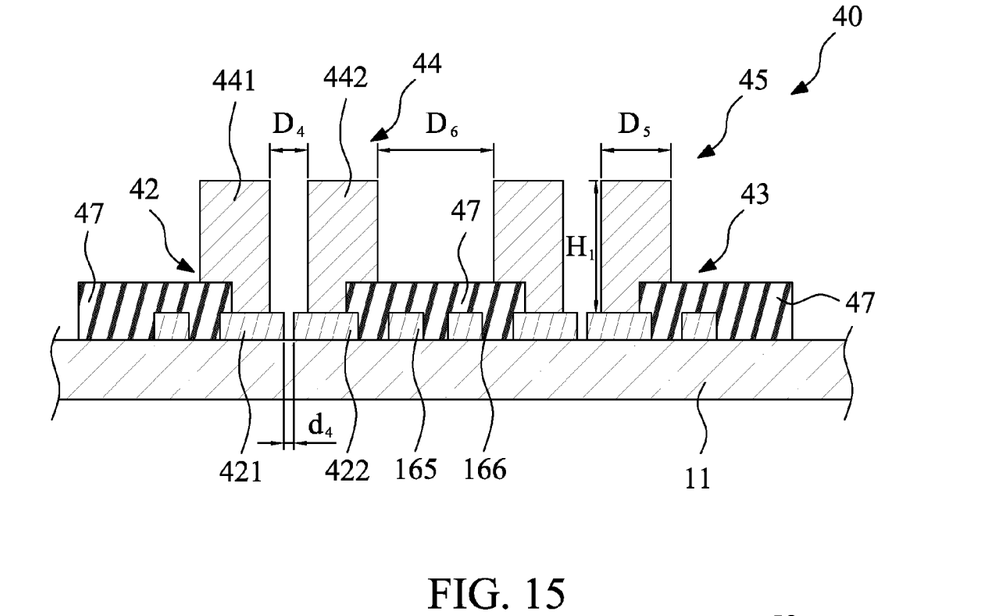
FIG. 15 is a cross-sectional schematic view along a sectional line A4-A4 in FIG. 13.

FIG. 13 is a schematic view of a substrate having metal pillar groups according to a seventh embodiment of the present disclosure. FIG. 14 is a partial enlarged schematic view of a conductive pad group and a metal pillar group according to the seventh embodiment. FIG. 15 is a cross-sectional schematic view along a sectional line A4-A4 in FIG. 13. With reference to the first embodiment and the second embodiment, similar components in the seventh embodiment are labeled with the same component numbers. Referring to FIG. 13 to FIG. 15, the substrate 40 includes: a body 11, conductive pad groups including conductive pad groups 42, 43, conductive traces including conductive traces 161, 162, 163, 164, 165, 166, and metal pillar groups including metal pillar groups 44, 45.

In the seventh embodiment, the conductive pad group 42 includes two conductive pads 421, 422. The conductive pad 421 has an inner side 425 and an outer side 426. The conductive pad 422 has an inner side 427 and an outer side 428. The metal pillar group 44 includes two metal pillars 441, 442 formed on the two conductive pads 421, 422, respectively, of the conductive pad group 42. The metal pillar 441 has an inner side 445 and an outer side 446. The metal pillar 442 has an inner side 447 and an outer side 448. The substrate 40 further includes a dielectric layer 47 surrounding the outer side of conductive pads such as the conductive pads 421, 422. The outer sides 446, 448 of the metal pillars 441, 442, respectively, extend over a part of the dielectric layer 47.

In the seventh embodiment, the minimum distance '$D_4$' between the inner side 445 of the metal pillar 441 and the inner side 447 of the metal pillar 442 is larger than the distance '$d_4$' between the inner side 425 of the conductive pad 421 and the inner side 427 of the adjacent conductive pad 422. It may be difficult to control evenness of holes where metal pillars are to be formed by plating due to an excessively large depth-to-width ratio in a dry film process. Therefore, the distance '$D_4$' between the inner side 445 of the metal pillar 441 and the inner side 447 of the metal pillar 442 can be increased, providing for reducing the risk of a short circuit connection (e.g., bridge) forming between the metal pillars 441 and 442 of the metal pillar group 44 during plating.

Moreover, in the seventh embodiment, as the outer sides 446, 448 of the metal pillars 441, 442, respectively, can extend over a part of the dielectric layer 47 and are not electrically connected to the conductive traces 165, 166, the area of the metal pillar 441 and the metal pillar 442 may be increased. Increased area may provide improved signal transmission at a connection with other components. Increased area may further increase mechanical strength of the metal pillars 441, 442, as well as improving alignment with other components.

In the seventh embodiment, the cross sections and heights of the illustrated metal pillars are substantially the same. In other embodiments, different pillars may have different cross sectional shapes or dimensions. In FIG. 15, a metal pillar of metal pillar group 45 of the seventh embodiment is illustrated as having a diameter '$D_5$'. Similarly, metal pillars, such as metal pillar 442 of metal pillar group 44, may have a diameter '$D_5$'. For the example of metal pillar 442, in one implementation the maximum distance '$D_5$' between the inner side 447 of the metal pillar 442 and the outer side 448 of the metal pillar 442 is approximately 80 μm, the height $H_1$ of the metal pillar 442 is approximately 50 μm, and the distance '$D_6$' between the outer side 448 of the metal pillar 442 and the outer side of the adjacent metal pillar is approximately 40 μm. In other implementations of the seventh embodiment, different distances '$D_5$' and '$D_6$' may be used, and metal pillar heights may be different. Examples include: a distance '$D_5$' may be less than a height of a metal pillar; a distance '$D_5$' may be less than a distance '$D_6$'; and a distance '$D_6$' may be greater than a height of a metal pillar.

Figure 16:
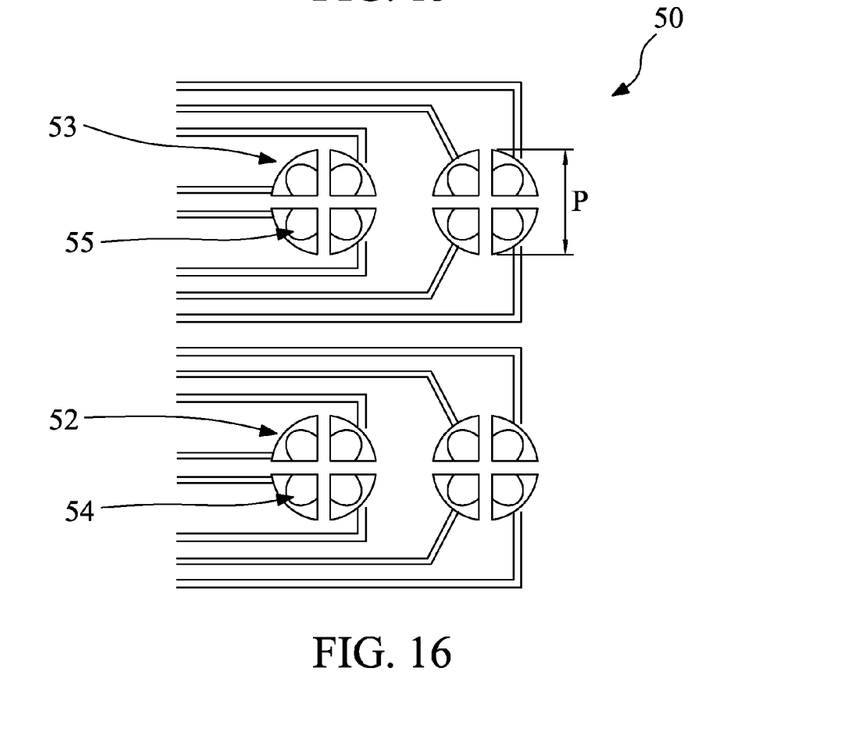
FIG. 16 is a schematic view of a substrate having a metal pillar group according to an eighth embodiment of the present disclosure.
Figure 17:
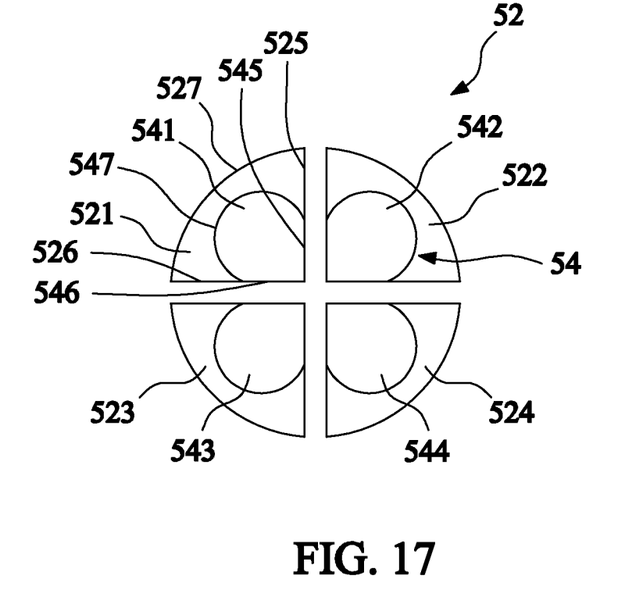
FIG. 17 is a partial enlarged schematic view of a conductive pad group and a metal pillar group according to the eighth embodiment of the present disclosure.

FIG. 16 is a schematic view of a substrate having metal pillar groups according to an eighth embodiment of the present disclosure. FIG. 17 is a partial enlarged schematic view of a conductive pad group and a metal pillar group according to the eighth embodiment. Referring to FIG. 16 and FIG. 17, the substrate 50 includes conductive pad groups including conductive pad groups 52, 53, and metal pillar groups including metal pillar groups 54, 55. In this embodiment, each conductive pad group includes four conductive pads. For example, the conductive pad group 52 includes four conductive pads 521, 522, 523, 524. In this embodiment, the outer perimeter of each conductive pad group is circular, and the perimeters of the conductive pads of the conductive pad groups each extend over approximately or at least one quarter of a circle. Each metal pillar group includes four metal pillars. For example, the metal pillar group 54 includes four metal pillars 541, 542, 543, 544 formed on four conductive pads 521, 522, 523, 524, respectively, of the conductive pad group 52.

Taking the conductive pad 521 and the metal pillar 541 as an example, the conductive pad 521 has two inner sides 525, 526 and an outer side 527. The metal pillar 541 has two inner sides 545, 546 and an outer side 547. The two inner sides 545, 546 of the metal pillar 541 partially align with the two inner sides 525, 526, respectively, of the conductive pad 521.

In the eighth embodiment, a diameter of the outside perimeter of one conductive pad group is shown as 'P'. As illustrated in FIG. 16, the conductive pad groups may have substantially equal cross-sectional structures and dimensions.

For example, the diameter of the outside perimeter of conductive pad group 52 may also be (but is not necessarily) substantially equal to 'P'. By way of comparison to a conventional conductive pad of diameter 'P', conductive pad group 52 may include four conductive pads (521, 522, 523, 524) and correspondingly allow for four metal pillars (541, 542, 543, 544), whereas a conventional conductive pad would only allow for one metal pillar. Thus, the number of I/O connections may be increased, and the area occupied by conductive pads, metal pillars, and conductive traces may be reduced. More generally, the number of conductive pads (and the corresponding number of metal pillars) in a conductive pad group can be two or more, three of more, four or more, five or more, or six or more.

Figure 18:
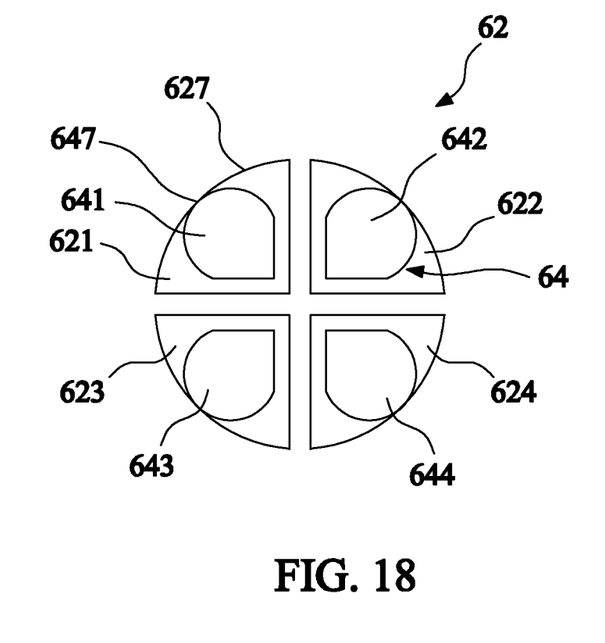
FIG. 18 is a partial enlarged schematic view of a conductive pad group and a metal pillar group according to a ninth embodiment of the present disclosure.

FIG. 18 is a partial enlarged schematic view of a conductive pad group 62 and a metal pillar group 64 according to a ninth embodiment of the present disclosure. In this embodiment, the conductive pad group 62 includes four conductive pads 621, 622, 623, 624, and the metal pillar group 64 includes four metal pillars 641, 642, 643, 644. Taking the conductive pad 621 and the metal pillar 641 as an example, the conductive pad 621 has two inner sides and an outer side 627, and the metal pillar 641 has two inner sides and an outer side 647. The outer side 647 of the metal pillar 641 partially aligns with the corresponding outer side 627 of the conductive pad 621.

Figure 19:
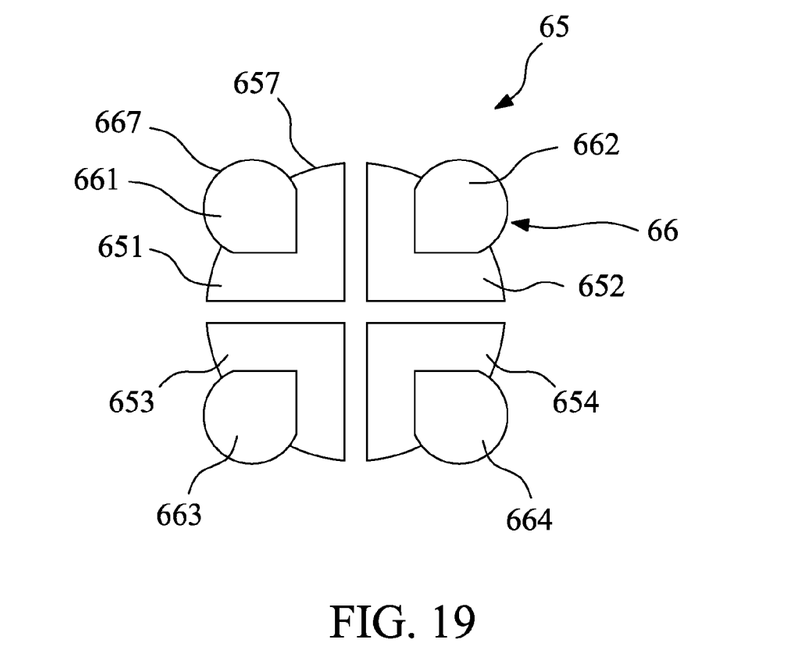
FIG. 19 is a partial enlarged schematic view of a conductive pad group and a metal pillar group according to a tenth embodiment of the present disclosure.

FIG. 19 is a partial enlarged schematic view of a conductive pad group 65 and a metal pillar group 66 according to a tenth embodiment of the present disclosure. In this embodiment, the conductive pad group 65 includes four conductive pads 651, 652, 653, 654, and the metal pillar group 66 includes four metal pillars 661, 662, 663, 664. Taking the conductive pad 651 and the metal pillar 661 as an example, the conductive pad 651 has two inner sides and an outer side 657, and the metal pillar 661 has two inner sides and an outer side 667. The outer side 667 of the metal pillar 661 is disposed outside the corresponding outer side 657 of the conductive pad 651.

Figure 20:
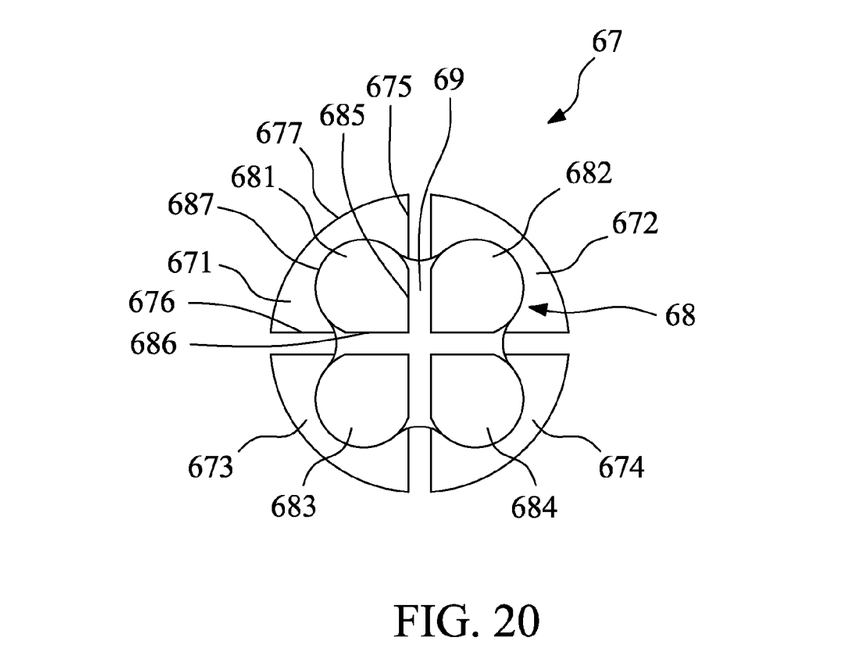
FIG. 20 is a partial enlarged schematic view of a conductive pad group and a metal pillar group according to an eleventh embodiment of the present disclosure.

FIG. 20 is a partial enlarged schematic view of a conductive pad group 67 and a metal pillar group 68 according to an eleventh embodiment of the present disclosure. In this embodiment, the conductive pad group 67 includes four conductive pads 671, 672, 673, 674, and the metal pillar group 68 includes four metal pillars 681, 682, 683, 684. Taking the conductive pad 671 and the metal pillar 681 as an example, the conductive pad 671 has two inner sides 675, 676 and an outer side 677, and the metal pillar 681 has two inner sides 685, 686 and an outer side 687. The two inner sides 685, 686 of the metal pillar 681 partially align with the two inner sides 675, 676, respectively, of the conductive pad 671. Furthermore, an insulating material 69 is disposed between the inner sides of the conductive pads 671, 672, 673, 674 of the conductive pad group 67 and between the inner sides of the metal pillars 681, 682, 683, 684 of the metal pillar group 68.

Figure 21:
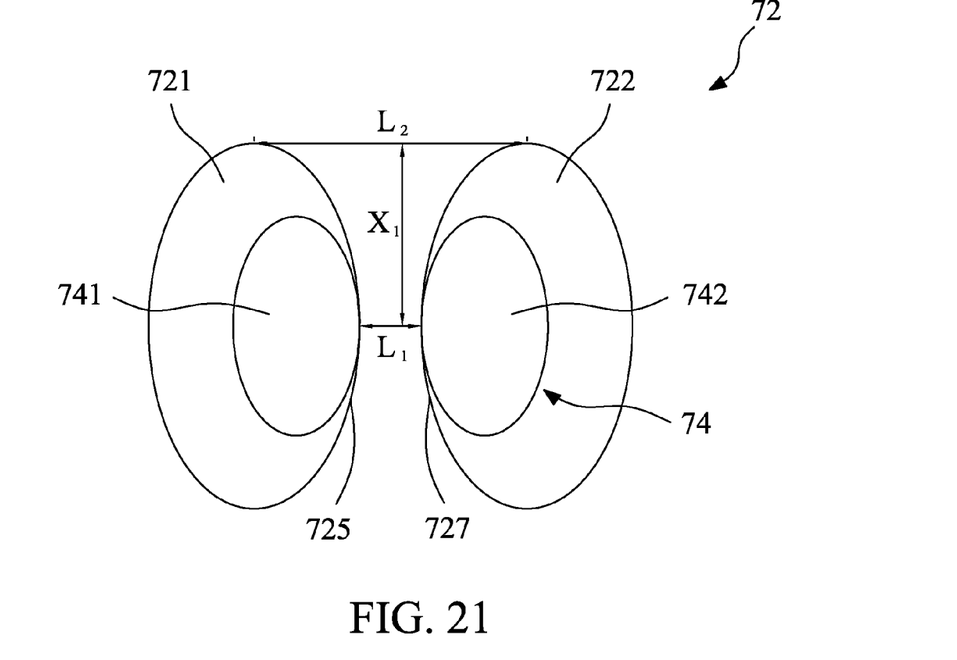
FIG. 21 is a partial enlarged schematic view of a conductive pad group and a metal pillar group according to a twelfth embodiment of the present disclosure.

FIG. 21 is a partial enlarged schematic view of a conductive pad group 72 and a metal pillar group 74 according to a twelfth embodiment of the present disclosure. In this embodiment, the conductive pads and metal pillars are elliptical. Conductive group 72 includes two conductive pads 721, 722. The metal pillar group 74 includes two metal pillars 741, 742. The conductive pad 721 has an inner side 725 and an outer side. The conductive pad 722 has an inner side 727 and an outer side. In this embodiment, the inner sides of the metal pillars 741, 742 partially align with the corresponding inner sides 725, 727 of the conductive pads 721, 722. A distance '$L_1$' exists between the inner side 725 of the conductive pad 721 and the inner side 727 of the adjacent conductive pad 722 at a minimum distance location. A distance '$L_2$' exists between apices of conductive pads 721 and 722 at a maximum distance location. The distance between the minimum distance location and the maximum distance location is shown in FIG. 21 as '$X_1$'. The difference between the distance '$L_1$' and the distance '$L_2$' (i.e., $L_2-L_1$) is X2, where 2 times $X_1$ is greater than X2 (i.e., $2X_1 > X2$).

Figure 22:
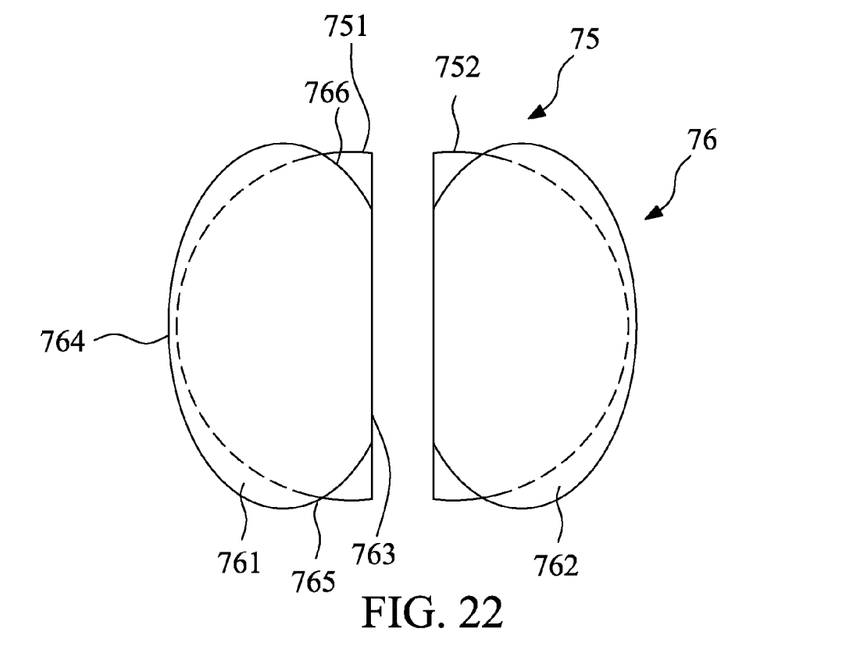
FIG. 22 is a partial enlarged schematic view of a conductive pad group and a metal pillar group according to a thirteenth embodiment of the present disclosure.

FIG. 22 is a partial enlarged schematic view of a conductive pad group 75 and a metal pillar group 76 according to a thirteenth embodiment of the present disclosure. The conductive pad group 75 includes two conductive pads 751, 752. The two conductive pads 751, 752 are semicircular. The metal pillar group 76 includes two metal pillars 761, 762. The metal pillars are substantially semicircular. In this embodiment, the inner sides of the metal pillars 761, 762 partially align with the corresponding inner sides of the conductive pads 751, 752. The metal pillar 761 has an inner side 763, an outer side 764 and two edges 765, 766. The inner side 763 is straight. The two edges 765, 766 between the inner side 763 and the outer side 764 of the metal pillar 761 are arc-shaped. By way of the construction illustrated in this embodiment, the area of a metal pillar may be increased.

Figure 23:
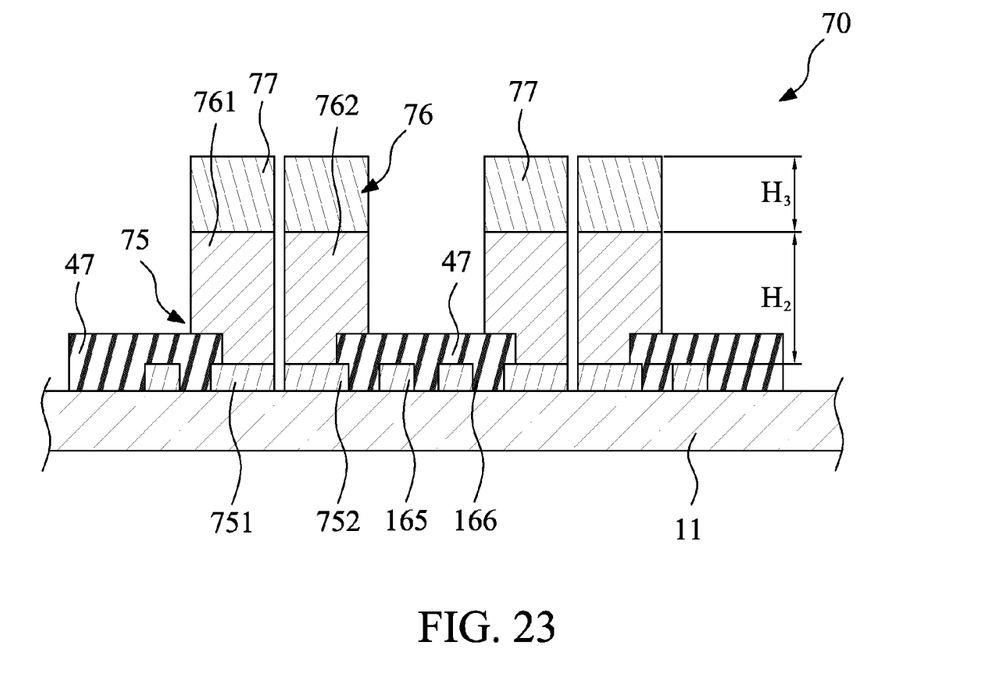
FIG. 23 is a cross-sectional schematic view of a substrate having a metal pillar group according to the thirteenth embodiment of the present disclosure.

FIG. 23 is a cross-sectional schematic view of a substrate having metal pillar groups according to the thirteenth embodiment. With reference to the seventh embodiment (FIGS. 13-15), similar components in the thirteenth embodiment are labeled with the same component numbers.

Referring to FIG. 22 to FIG. 23, the substrate 70 of the thirteenth embodiment includes: a body 11, conductive pad groups including conductive pad group 75, conductive traces including conductive traces 165, 166, and metal pillar groups including metal pillar group 76. In this embodiment, solder 77 is disposed on metal pillars, such as metal pillars 761, 762 of the metal pillar group 76. One or more metal pillars have a height '$H_2$', with a height of the solder 77 being '$H_3$'. In one implementation, the height '$H_2$' of a metal pillar is approximately 70 μm, and the height '$H_3$' of solder 77 is approximately 40 μm. In other embodiments, height '$H_2$' may be greater or less than 70 μm, and height '$H_3$' may be greater or less than 40 μm.

Figure 24:
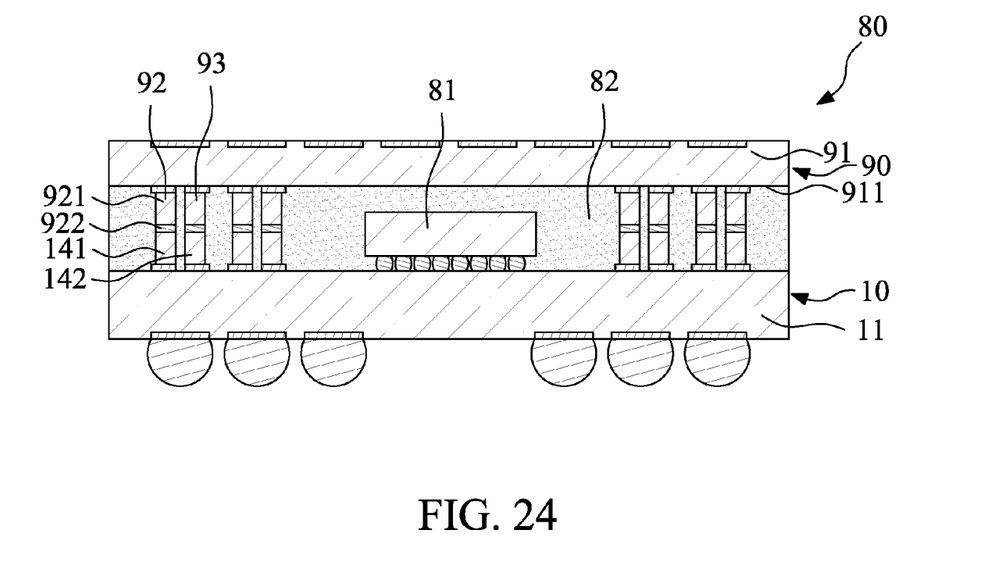
FIG. 24 is a schematic view of a semiconductor package having a metal pillar group according to the present disclosure.

FIG. 24 is a schematic view of a semiconductor package 80 having metal pillar groups according to one or more embodiments of the present disclosure. In one embodiment, the semiconductor package 80 includes: a first substrate 10, a second substrate 90, a chip 81, and a mold compound 82, where the first substrate 10 is similar to the substrate 10 in the first embodiment in FIG. 1 to FIG. 3, and similar components are labeled with the same component numbers. Referring to FIG. 1 to FIG. 3 along with FIG. 24, the first substrate 10 includes: a first body 11, at least one conductive pad group (e.g., conductive pad groups 12, 13), conductive traces (e.g., conductive traces 161-166), and at least one metal pillar group (e.g., at least one of metal pillar groups 14, 15). The first body 11 has a first surface (e.g., first surface 111). The conductive pad groups are disposed on the first surface. Each conductive pad group may include multiple conductive pads. Each conductive pad has at least one inner side and at least one outer side, where the inner sides of the adjacent conductive pads face each other (e.g., the inner side 125 of the conductive pad 121 is faced to the inner side 127 of the adjacent conductive pad 122 and a narrow spaced section 129 is formed between the inner sides 125, 127). The conductive traces are electrically connected to certain ones of the conductive pads. The metal pillars of the metal pillar groups are formed on the conductive pads of the conductive pad groups (e.g., metal pillar groups 14, 15 are formed on the conductive pad groups 12, 13, respectively). Each metal pillar group may include multiple metal pillars, respectively formed on multiple conductive pads of a conductive pad group (e.g., metal pillar group 14 includes two metal pillars 141, 142, respectively formed on the two conductive pads 121, 122 of the conductive pad group 12).

The second substrate 90 of FIG. 24 includes a second body 91 and multiple conductive contacts such as conductive contacts 92, 93. The second body 91 has a second surface 911 faced towards the first surface (e.g., first surface 111) of the first body 11. The conductive contacts of the second substrate 90 are electrically connected to the at least one metal pillar group of the first substrate 10. In the implementation illustrated in FIG. 24, the conductive contacts 92, 93 of the second substrate 90 are electrically connected to the metal pillars 141, 142, respectively, of a metal pillar group (e.g., metal pillar group 14) of the first substrate 10. Also in the implementation illustrated in FIG. 24, the conductive contact 92 includes a metal bump 921 and a solder 922. The solder 922 is physically joined with the metal pillar 141. The conductive contact comprises a melted conductive part, and a melting point of the melted conductive part is lower than a melting point of the metal pillar.

In the embodiment illustrated in FIG. 24, the chip 81 is disposed between the first substrate 10 and the second substrate 90, and is electrically connected to the first substrate 10 and/or the second substrate 90. The encapsulation material 82 is disposed between the first substrate 10 and the second substrate 90, and surrounds the chip 81.

By way of a conductive pad group having multiple conductive pads such that multiple metal pillars may be correspondingly disposed, the number of metal pillars for a given area in a semiconductor package in accordance with the present disclosure can be significantly increased over conventional conductive pads, thereby increasing the number of available I/O connections. Further, for a given number of I/O connections, the area occupied by conductive pads, metal pillars, and conductive traces may be reduced.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A substrate, comprising:
   a body having a surface;
   a conductive pad group disposed on the surface, wherein the conductive pad group comprises a plurality of conductive pads each with at least one inner side and at least one outer side, a first inner side of a first conductive pad is faced towards a second inner side of an adjacent second conductive pad, and the first inner side and the second inner side are separated by a spaced section;
   a plurality of conductive traces electrically connected to respective ones of the conductive pads; and
   a metal pillar group formed on the conductive pad group, the metal pillar group including a plurality of metal pillars formed on corresponding ones of the conductive pads;
   wherein a metal pillar of the metal pillar group includes a pillar inner side and a pillar outer side, and either: the pillar inner side partially aligns with the first inner side of the first conductive pad; or the pillar outer side partially aligns with an outer side of a corresponding conductive pad.

2. The substrate as claimed in claim 1, further comprising a dielectric layer surrounding the at least one outer side of conductive pad of the conductive pad group.

3. The substrate as claimed in claim 2, wherein each metal pillar has at least one inner side and at least one outer side, and the at least one outer side of the metal pillar contacts a part of the dielectric layer.

4. The substrate as claimed in claim 3, further comprising an insulating material disposed between the first inner side of the first conductive pad and the second inner side of the adjacent second conductive pad, and between the third inner side of the first metal pillar and a fourth inner side of an adjacent second metal pillar, wherein the first metal pillar and the second metal pillar are included in the metal pillar group.

5. The substrate as claimed in claim 1, wherein a portion of a metal pillar of the metal pillar group extends over a part of the dielectric layer.

6. The substrate as claimed in claim 1, wherein the first inner side of the first conductive pad is parallel to the second inner side of the adjacent second conductive pad.

7. The substrate as claimed in claim 1, wherein:
   a distance between the first inner side of the first conductive pad and the second inner side of the adjacent second conductive pad is at a minimum in a first location;
   a distance between the first inner side of the first conductive pad and the second inner side of the adjacent second conductive pad is at a maximum in a second location;
   a distance between the first location and the second location is X1;
   the difference between the minimum distance and the maximum distance is X2; and
   two times X1 is greater than X2.

8. The substrate as claimed in claim 1, wherein the perimeter of the conductive pad group is circular, and the conductive pad group comprises two semicircular conductive pads.

9. The substrate as claimed in claim 1, wherein the conductive pad group comprises two elliptical conductive pads.

10. The substrate as claimed in claim 1, wherein the metal pillars of the metal pillar group are elliptical.

11. The substrate as claimed in claim 1, wherein the perimeter of the conductive pad group is circular, the conductive pad group comprises four conductive pads, and the perimeter of each conductive pad extends over one quarter of a circle.

12. The substrate as claimed in claim 1, comprising a plurality of conductive pad groups and a corresponding plurality of metal pillar groups, and further comprising a seed layer formed between ones of the plurality of conductive pad groups and corresponding ones of the plurality of metal pillar groups.

13. The substrate as claimed in claim 1, wherein each metal pillar has at least one inner side and at least one outer side, and a maximum distance between an inner side of a first metal pillar and an outer side of the first metal pillar is smaller than a maximum distance between the first inner side of the first conductive pad and an outer side of the first conductive pad.

14. The substrate as claimed in claim 1, wherein each metal pillar has at least one inner side and at least one outer side, a minimum distance between an inner side of a first metal pillar and an inner side of an adjacent second metal pillar in the metal pillar group is larger than a minimum distance between the first inner side of the first conductive pad and the second inner side of the adjacent second conductive pad.

15. The substrate as claimed in claim 1, wherein each metal pillar has a straight inner side, an outer side and at least one edge, the at least one edge is disposed between the inner side and the outer side of the metal pillar, and the at least one edge is arc-shaped.

16. A semiconductor package, comprising:
a first substrate comprising a first body;
a conductive pad group;
a plurality of conductive traces; and
a metal pillar group;
wherein the first body has a surface, the at least one conductive pad group is disposed on the surface, each conductive pad group comprises a plurality of conductive pads, each conductive pad has at least one inner side and at least one outer side; and
wherein an inner side of a first conductive pad is faced to an inner side of an adjacent second conductive pad, and the first and second conductive pads are separated by a spaced section; and
wherein the conductive traces are electrically connected to ones of the conductive pads, the metal pillar group is formed on the conductive pad group, and the metal pillar group comprises a plurality of metal pillars formed on respective ones of the conductive pads;
a second substrate comprising a second body and a plurality of conductive contacts, wherein the second body has a second surface faced to the first surface of the first substrate, the plurality of conductive contacts of the second substrate are electrically connected to respective ones of the metal pillar group of the first substrate;
a chip disposed between the first substrate and the second substrate, and electrically connected to the first substrate or the second substrate; and
an encapsulation material disposed between the first substrate and the second substrate, and surrounding the chip;
wherein a metal pillar of the metal pillar group includes a pillar inner side and a pillar outer side, and either: the pillar inner side partially aligns with the inner side of the first conductive pad; or the pillar outer side partially aligns with an outer side of a corresponding conductive pad.

17. The semiconductor package as claimed in claim 16, wherein the conductive contacts of the second substrate each comprise a metal bump and a solder, and the solder is physically joined with a respective metal pillar.

18. The semiconductor package as claimed in claim 16, wherein the conductive contacts of the second substrate each comprise a melted conductive part, and a melting point of the melted conductive part is lower than a melting point of the metal pillars of the metal pillar group of the first substrate.

19. The semiconductor package as claimed in claim 16, wherein a width of the spaced section is 8 µm or less.

* * * * *